United States Patent [19]
Odagawa et al.

[11] Patent Number: 5,987,044
[45] Date of Patent: Nov. 16, 1999

[54] SEMICONDUCTOR LIGHT SOURCE SYSTEM HAVING AN OPTIMIZED SETTING FOR DRIVING A LASER DIODE

[75] Inventors: Tetsufumi Odagawa; Kiyohide Wakao, both of Kawasaki, Japan

[73] Assignee: Fujitsu Limited, Kawasaki, Japan

[21] Appl. No.: 08/780,934

[22] Filed: Oct. 11, 1996

Related U.S. Application Data

[63] Continuation of application No. 08/352,776, Dec. 1, 1994, abandoned, and application No. 08/002,763, Jan. 11, 1993, abandoned.

[30] Foreign Application Priority Data

Jan. 10, 1992 [JP] Japan ................................. 4-002793

[51] Int. Cl.$^6$ ...................................................... H01S 3/00
[52] U.S. Cl. ................................................................ 372/38
[58] Field of Search ................................ 372/38, 29, 31, 372/32

[56] References Cited

FOREIGN PATENT DOCUMENTS 0 120 389  10/1984  European Pat. Off. .
0 292 957  11/1988  European Pat. Off. .

OTHER PUBLICATIONS

Patent Abstracts of Japan, vol. 8, No. 91 (E–241), Apr. 26, 1984 & JP–A–59 009988 (Hitachi Seisakusho KK), Jan. 19, 1984.
Patent Abstracts of Japan, vol. 8, No. 198 (E–265), Sep. 11, 1984 & JP–A–59 084591 (Fujitsu KK), May 16, 1984.
Patent Abstracts of Japan, vol. 9, No. 136 (E–320), Jun. 12, 1985 & JP–A–60 018982 (Fujitsu KK), Jan. 31, 1985.

*Primary Examiner*—Rodney Bovernick
*Assistant Examiner*—Robert E. Wise
*Attorney, Agent, or Firm*—Staas & Halsey LLP

[57] ABSTRACT

A semiconductor light source system includes a laser diode that is operated in a variable temperature environment and a driver circuit, wherein the driver circuit sets a magnitude of a signal current supplied to the laser diode below an upper limit level that corresponds to a maximum operational temperature of the laser diode. The driver circuit simultaneously sets a relative magnitude of the signal current with respect to a bias current such that a sufficient extinction ratio is achieved in an output optical beam and further sets a relative magnitude of the signal current with respect to the bias current such that a sufficiently small oscillation delay is achieved in the laser diode.

14 Claims, 6 Drawing Sheets

FIG. 1

PRIOR ART

SEMICONDUCTOR LIGHT SOURCE SYSTEM HAVING AN OPTIMIZED SETTING FOR DRIVING A LASER DIODE

This application is a continuation, of application Ser. Nos. 08/352,776 and 08/002,763, filed Dec. 1, 1994 and Jan. 11, 1993, respectively, now abandoned.

BACKGROUND OF THE INVENTION

Laser diodes are used extensively particularly in the fields of optical telecommunication and optical storage of information. Further, various applications of laser diodes are studied for example in the field of optical information processing such as optical computers.

In laser diodes, it is well known that the operational characteristics, particularly the threshold of laser oscillation, change with environmental temperature. Thus, in order to compensate for such a temperature-induced variation of the operational characteristics, the laser diode used for long range telecommunication purposes, such as the devices used for optical submarine cables, use a temperature regulation system such that the laser diode is held at a constant temperature.

On the other hand, there exist other applications of laser diodes wherein use of such a temperature regulation system is not possible or preferable. For example, the laser diodes used in the optical wiring of supercomputers have to be accommodated in a very limited space and the room for the temperature regulator is generally not available. Similarly, temperature regulation is not practical for the laser diodes that are used for the local area network (LAN), laser printers, and the like, because of the increased cost.

In order to avoid the unwanted temperature-induced fluctuation in the operation of laser diodes, conventional semiconductor optical sources use a feedback control of the optical beam, called automatic power control (APC), wherein the bias current is controlled such that the power of the output optical pulse of the laser diode is held constant. On the other hand, such an APC control has a problem in that, associated with the temperature-induced variation of the threshold of laser oscillation, the extinction ratio of the laser diode deteriorates with increasing temperature.

Figure 1:
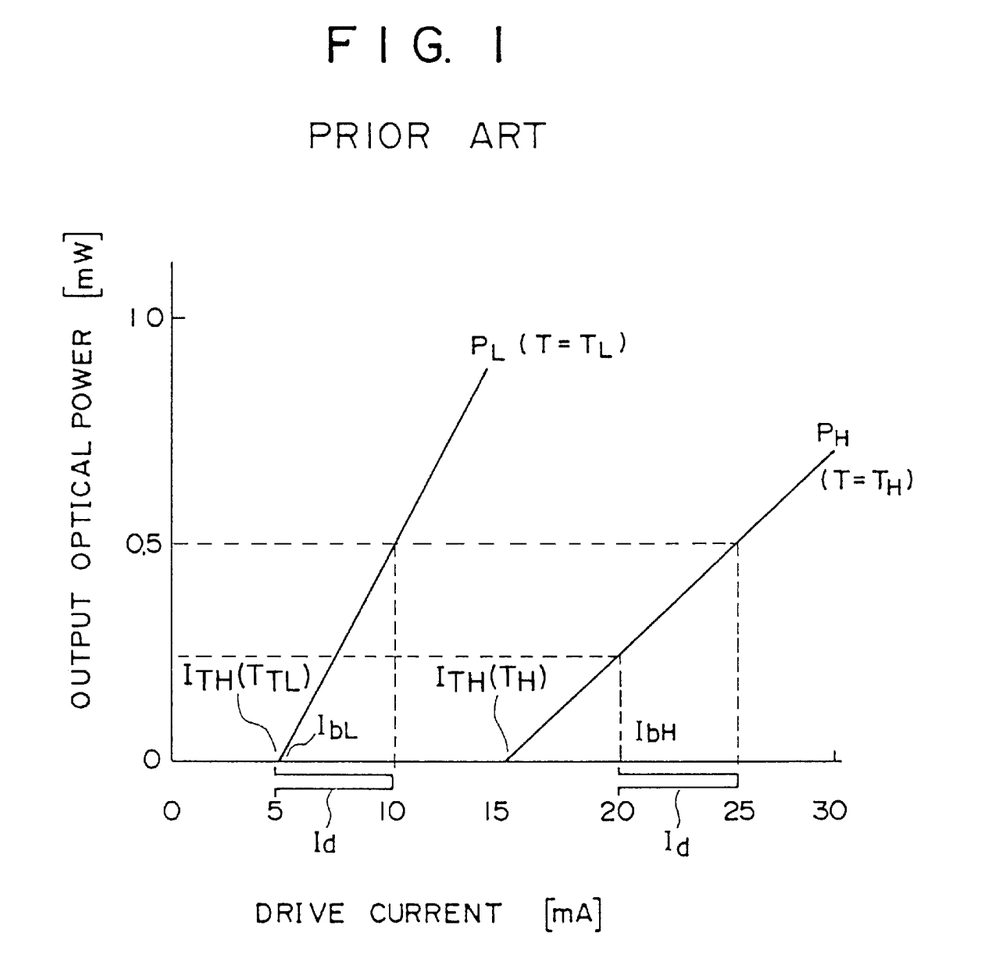
FIG. 1 is a diagram showing the relationship between an optical output power and a drive current of a typical laser diode at different temperatures.

FIG. 1 shows the conventional APC control applied to laser diodes, wherein the horizontal axis represents the drive current while the vertical axis represents the corresponding output optical power. Further, the line designated as $P_L$ represents the output characteristics of the laser diode at a low temperature $T_L$, while the line designated as $P_H$ represents the output characteristics of the same laser diode at a high temperature $T_H$. It will be noted that the characteristic line $P_L$ indicates a threshold level $I_{TH}(T_L)$ at the temperature $T_L$, while the characteristic line $P_H$ indicates a threshold level $I_{TH}(T_H)$ at the temperature $T_H$.

Referring to FIG. 1, the drive current is supplied to the laser diode in the form of a current pulse $I_d$, wherein the current pulse $I_d$ is biased at a level $I_{bL}$ that is set equal to the threshold level $I_{TH}(T_L)$ at the temperature $T_L$, such that the laser oscillation occurs with a minimum threshold power level when no current pulse $I_d$ is supplied. Further, the magnitude of the current pulse $I_d$ is set such that a predetermined output power is achieved in response to the drive current pulse $I_d$ at the foregoing low temperature. In the illustrated example, the magnitude of the current pulse $I_d$ is set to 5 mA.

In the APC control, the biasing $I_b$ of the current pulse $I_d$ is subjected to a feedback control that is achieved in response to the output power of the laser diode, such that a predetermined output power such as 0.5 mW is maintained even when the temperature of the laser diode changes. More specifically, the bias current $I_b$ added to the current pulse $I_d$ is changed such that the laser diode produces the foregoing predetermined output power in response to the current pulse $I_d$.

When the biasing of the drive current pulse $I_d$ is set as such, there occurs a problem, when the temperature rises, in that the laser diode produces the optical output with a substantial power even when the current pulse $I_d$ is not supplied. In the illustrated example, the current pulse $I_d$ is biased at the level $I_{bH}$ of 20 mA at the temperature $T_H$, and the laser diode produces the output optical power of about 0.25 mW in the absence of the input current pulse $I_d$. Thereby, the extinction ratio of the output optical beam is inevitably deteriorated. Associated with the degradation of the extinction ratio, the S/N ratio of the optical information transmission achieved by the laser diode is deteriorated.

In order to maintain the output power of the optical beam constant, irrespective of a variation of the temperature, it is also possible to change the magnitude of the drive current pulse $I_d$ in response to the variation of temperature. For example, one may fix the level of the bias current at $I_{TH}(T_L)$ and increase the magnitude of the current pulse $I_d$ with temperature such that the output power of 0.5 mW is secured even when the temperature increases. According to this approach, one can maintain a large extinction ratio. However, the foregoing approach has a drawback in that there tends to occur a delay in the timing of the optical pulse in correspondence to the interval necessary for the drive current to increase from the level $I_{TH}(T_L)$ to the desired level such as 25 mA. In the illustrated example, it should be noted that the laser diode does not cause oscillation until the level of the drive current pulse $I_d$ reaches the level of 15 mA, and a time lag occurs in the optical pulse produced as a result of the laser oscillation.

In the applications where the use of expensive APC or automatic feedback control of the bias current is not desirable, therefore, one has to optimize the bias condition as well as the magnitude of the drive current pulse such that the problem of the degradation of the extinction ratio, as well as the problem of the oscillation delay of laser diode, is minimized.

Figure 2:
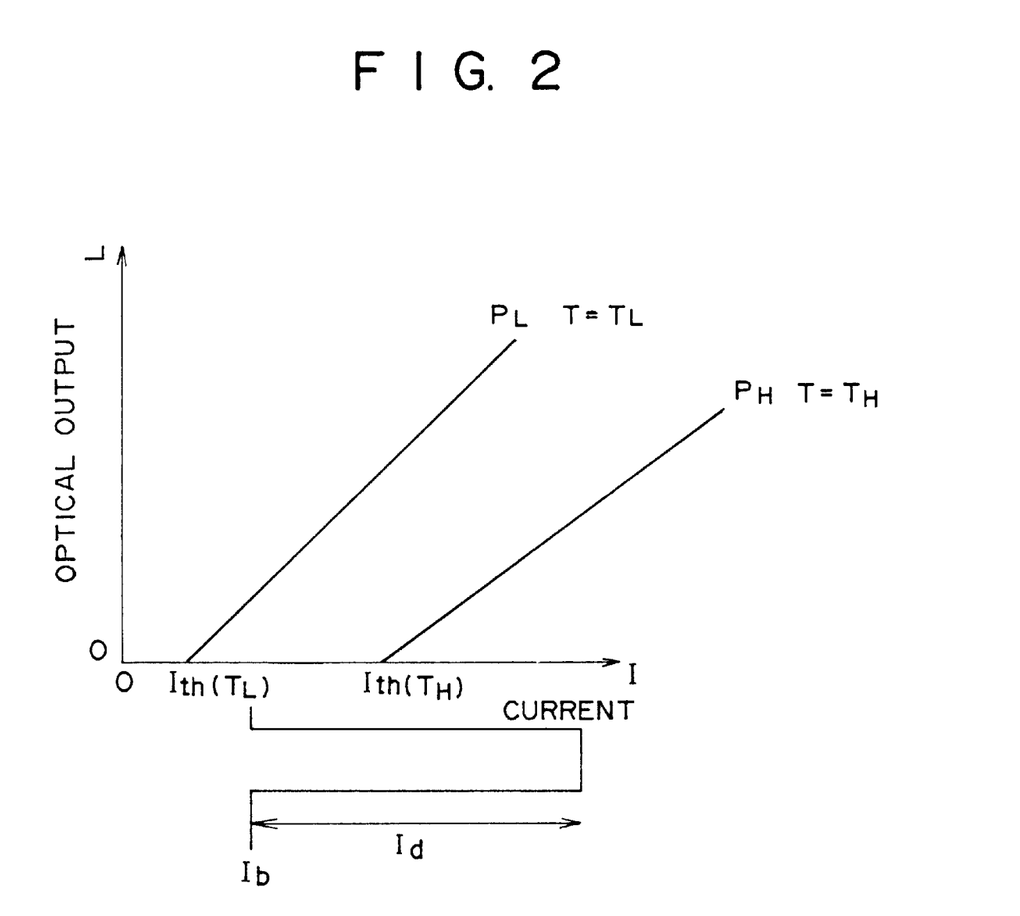
FIG. 2 is a diagram showing a general setting of bias current and drive current pulse for driving a laser diode.
Figure 3A:
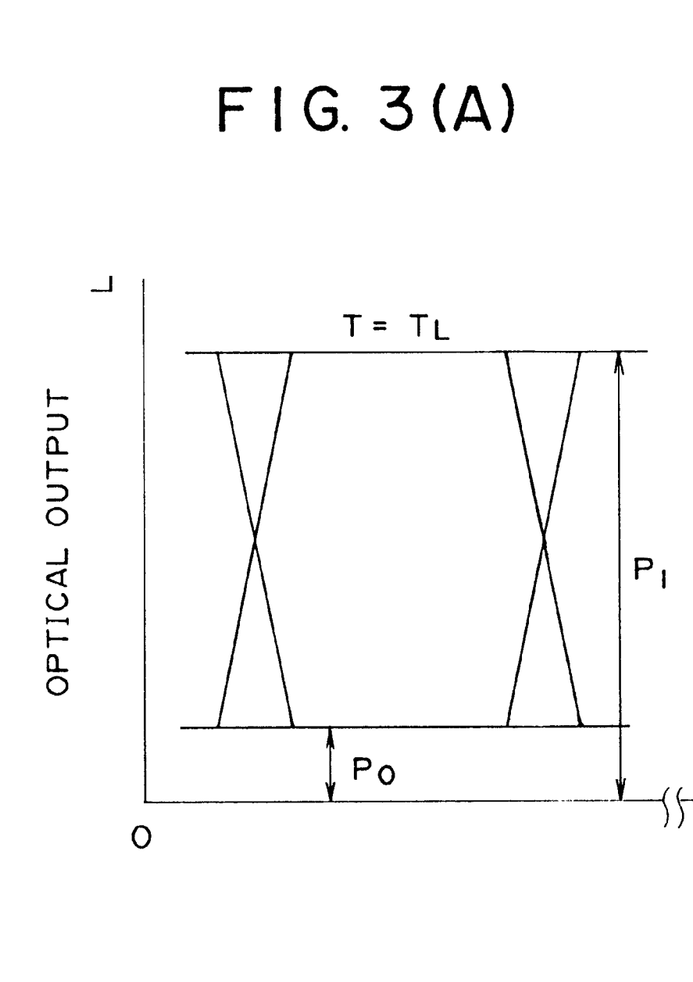
FIGS. 3(A) and 3(B) are diagrams showing the eye pattern of the laser diode that is driven in accordance with the setting shown in FIG. 2.
Figure 3B:
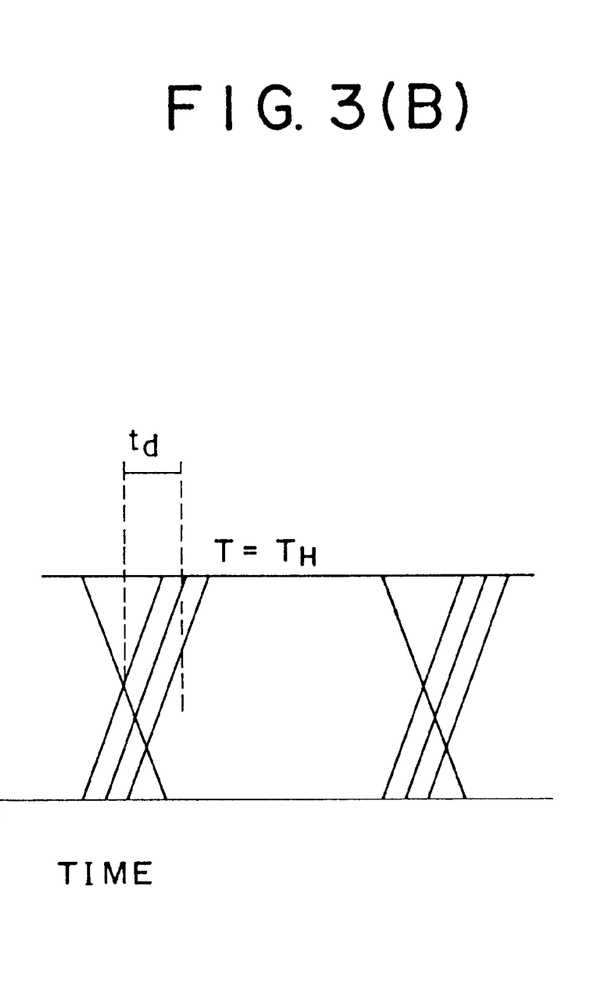

FIGS. 3(A) and 3(B) show the eye patterns that are obtained as a result of the biasing shown in FIG. 2, wherein, in FIG. 2, it will be noted that the bias current $I_b$ is set between the level $I_{TH}(T_L)$ and the level $I_{TH}(T_H)$, and the magnitude of the drive current pulse $I_d$ is set such that the overall drive current I, defined as a sum of the bias current $I_b$ and the drive current pulse $I_d$ (I=$I_b$+$I_d$), exceeds the threshold $I_{th}(T_H)$.

Referring to FIG. 3(A) showing the eye pattern at the temperature $T_L$, the vertical axis represents the optical output power, while the horizontal axis represents the time. There, it will be noted that the laser diode produces the output optical power $P_0$ in correspondence to the binary signal "0" wherein the drive current is set equal to the bias current $I_b$. Further, in correspondence to the binary signal "1" wherein the drive current is set equal to the sum of the bias current $I_b$ and the drive current pulse $I_d$, it will be noted that the laser diode produces the output optical power at the level $P_1$.

With continuous operation of the laser diode, the temperature of the laser diode increases gradually from $T_L$ and reaches $T_H$. Thus, the eye pattern shown in FIG. 3(A) shifts gradually to the right with time as shown in FIG. 3(B), and there appears a delay $t_d$ in the timing of the optical pulse as indicated in FIG. 3(B). When such a delay $t_d$ occurs, the time slot represented by the open area in the eye pattern inevitably decreases. It will be noted that the foregoing problem becomes particularly acute in the optical systems wherein a laser diode array, including a large number of laser diodes, is accommodated in a small space without temperature regulation as in the case of the foregoing optical wiring, optical local area network, optical print head of laser printers, and the like. In the optical systems of the foregoing type, a mere increase of the drive current pulse $I_d$ for increasing the extinction ratio may invite unwanted temperature increase that in turn results in an unwanted deterioration of the eye pattern characteristics.

SUMMARY OF THE INVENTION

Accordingly, it is a general object of the present invention to provide a novel and useful semiconductor optical source, wherein the foregoing problems are eliminated.

Another and more specific object of the present invention is to provide a semiconductor optical source including a laser diode and driving means for driving the laser diode in response to an external signal, wherein the driving means supplies a drive current to the laser diode as a sum of a bias current and a signal current pulse with an optimized magnitude with respect to a given system specification of a system to which the semiconductor optical source cooperates.

Another object of the present invention is to provide a semiconductor optical source for producing an output optical signal in response to an input electrical signal, comprising: a laser diode supplied with a drive current for producing said output optical signal in response thereto, said laser diode having a temperature-dependent operational characteristic that describes a relationship between an output power of said optical signal that is produced by said laser diode and a drive current that is supplied thereto, said semiconductor optical source being constructed such that said laser diode operates at a variable operational temperature; biasing means for producing a bias current having a first predetermined magnitude; driver means supplied with said input electrical signal for producing a signal current in response thereto with a second predetermined magnitude; and feeding means supplied with said bias current and said signal current, respectively from said biasing means and said driver means, to produce said drive current as a sum of said bias current and said signal current, said driver means supplying said drive current to said laser diode; said biasing means setting said first magnitude of said bias current such that an operational temperature of said laser diode is maintained equal to or lower than a temperature limit above which a normal operation of said laser diode is not guaranteed; said driver means setting a relative ratio between said first magnitude of said bias current and said second magnitude of said drive current pulse such that an extinction ratio exceeding a predetermined extinction ratio is obtained at a lowest operational temperature of said laser diode; said driver means further setting a relationship between said first magnitude of said bias current and said second magnitude of said signal current such that an oscillation delay of said laser diode is held below a predetermined delay time.

According to the present invention, one can optimize the operational condition of the laser diode that forms the semiconductor optical source wherein the temperature regulation of the laser diode is not employed, such that the laser diode provides a satisfactory extinction ratio and a satisfactory oscillation delay even when the operational temperature of the laser diode changes as a result of the operation or as a result of the variation of the environmental temperature.

Other objects and further features of the present invention will become apparent from the following detailed description when read in conjunction with the attached drawings.

DETAILED DESCRIPTION OF THE PREFERRED EMBODIMENTS

Figure 4:
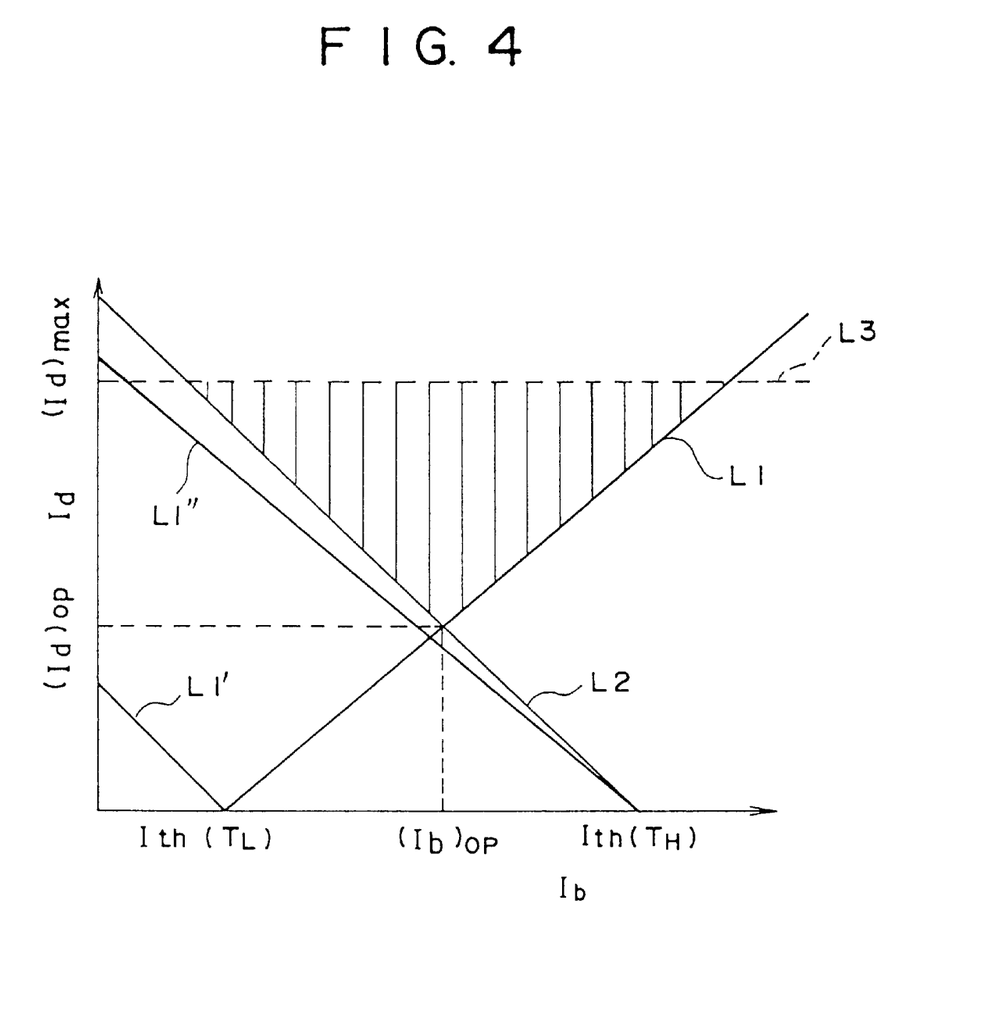
FIG. 4 is a diagram showing the principle of the present invention for optimizing the operational condition of a laser diode.

FIG. 4 shows the principle of the optimization of the operational condition of the laser diode according to the present invention. In FIG. 4, it will be noted that the vertical axis represents the magnitude of the drive current pulse $I_d$ while the horizontal axis represents the magnitude of the bias current $I_b$.

Referring to FIG. 4 representing the optimum operational condition by a hatched region, the upper boundary of the hatched region is defined by an upper limit $(I_d)_{max}$ of the drive current pulse $I_d$. There, the foregoing upper limit $(I_d)_{max}$ is defined from the condition that the operational temperature of the laser diode has to be set below the highest tolerable operational temperature $T_H$ above which the normal operation of the laser diode is not guaranteed. As the operational temperature of the laser diode is represented as a sum of the environmental temperature $T_{OH}$ and the temperature increase $\delta T$ of the laser diode due to the operation, the foregoing condition is represented as $$T_{OH} + \delta T(I_d) < T_H \qquad (1)$$

where it will be noted that the temperature increase $\delta T$ is represented as a function of the drive current pulse $I_d$. In FIG. 4, the boundary represented by the inequality (1) is represented as $L_3$.

On the other hand, in order to secure a sufficient extinction ratio that is at least equal to or larger than a predetermined extinction ratio R, one has to set the bias current $I_b$ and the drive current pulse $I_d$ to satisfy the relationship $$(I_b + I_d - I_{th}(T_L))/(I_b - I_{th}(T_L)) \geq R \qquad (2),$$

wherein the predetermined extinction ratio R is specified from the system requirement of a system that cooperates with the semiconductor optical source. In FIG. 4, the relationship of Eq.(2) is represented by a line $L_1$. It should be noted that the foregoing Eq.(2) holds true in the region where the bias current $I_b$ exceeds the threshold current $I_{th}(T_L)$ for the temperature $T_L$.

On the other hand, the drive current pulse $I_d$ has to be set such that the sum of the bias current $I_b$ and the drive current pulse $I_d$ exceeds the threshold $I_{th}$, in order that the laser diode cause the laser oscillation. In other words, the drive current $I_d$ has to be set larger than the characteristic line that is designated in FIG. 4 as $L_1'$ and is represented as $$I_d = -I_b + I_{th}(T_L)$$

in the region where the current $I_b$ is smaller than $I_{th}(T_L)$. Further, the drive current $I_d$ has to be set larger than the characteristic line that is designated in FIG. 4 as $L_1''$ and is represented as $$I_d = -I_b + I_{th}(T_H)$$

The hatched region of FIG. 4 is further defined by a characteristic line $L_2$, wherein the line $L_2$ represents the condition that the delay $\tau_0$ in the laser oscillation becomes equal to or smaller than the oscillation delay that is tolerated in the system that cooperates with the semiconductor optical source. Generally, the delay $\tau$ is represented as $$\tau = \tau_s \log I_d/[I_d - \{I_{TH}(T_H) - I_b\}] \qquad (3),$$

where $\tau_s$ represents the carrier lifetime, and the condition corresponding to the line $L_2$ is represented as $$\tau \leq \tau_0. \qquad (4)$$

Thereby, the condition (4) is represented as $$I_d \geq (I_{th}(T_H) - I_b) \cdot \exp(\tau_0/\tau_s)/[\exp(\tau_0/\tau_s) - 1] \qquad (5)$$

From the inequalities (1), (2) and (5), it will be understood that the optimum operational condition that provides a satisfactory extinction ratio R and a satisfactory oscillation delay $\tau$ while simultaneously prohibiting the excessive temperature rise of the laser diode, is represented by the hatched region of FIG. 4. Particularly, the combination of the optimized drive current pulse $(I_d)_{op}$ and the optimized bias current $(I_b)_{op}$ as shown in FIG. 4 is most preferable from the view point of the smallest heat generation that is advantageous for extending the lifetime of the laser diode. It should be noted that the line L1" and the line L2 have a common interception $I_{th}(T_H)$ on the $I_b$ axis, while the gradient of the line L2 always exceeds the gradient of the line L1". In other words, there holds a relationship $$-\exp(\tau_0/\tau_s)/[\exp(\tau_0/\tau_s)-1] < -1,$$

indicating the lines L1' and L1" being located always below the line L2. Thereby, the condition pertinent to the lines L1' and L1" does not affect the foregoing optimization of the laser driving condition.

Figure 5A:
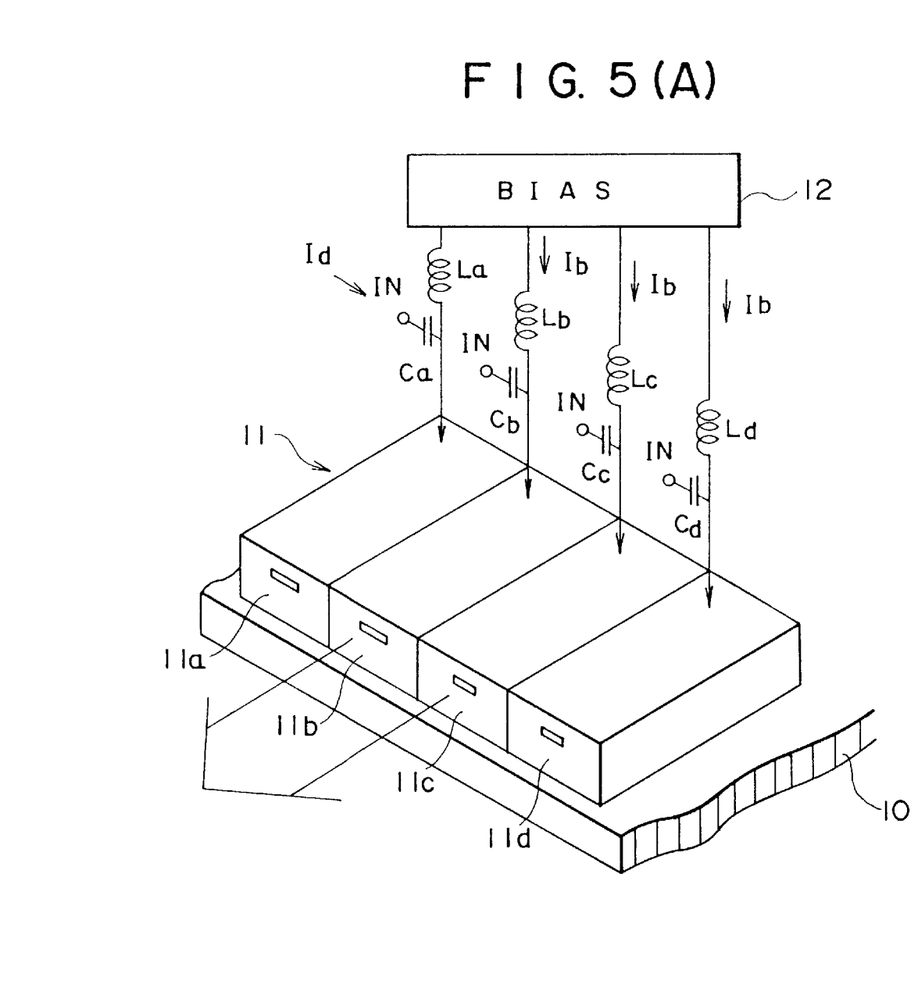
FIGS. 5(A) and 5(B) are diagrams showing schematically the construction of a semiconductor optical source according to an embodiment of the present invention.
Figure 5B:
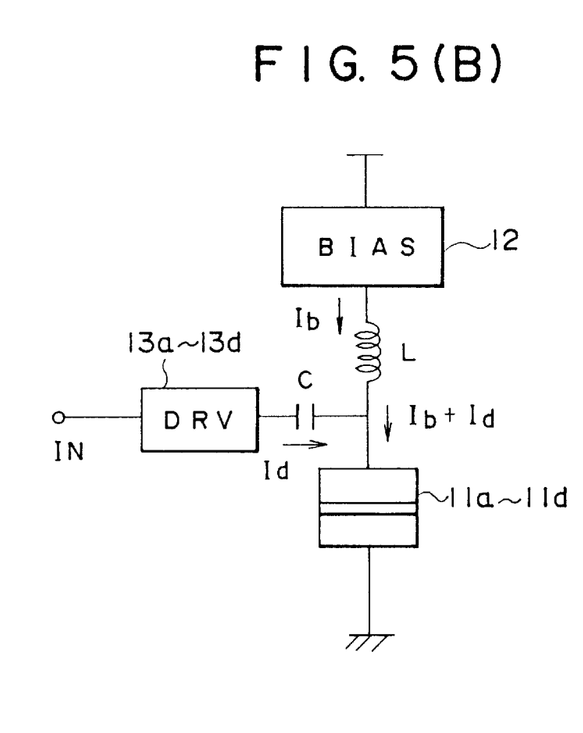

FIG. 5(A) shows the construction of a semiconductor optical source according to a first embodiment of the present invention, wherein it will be noted that the semiconductor optical source includes a substrate 10, and the substrate 10 carries thereon a number of laser diodes 11a–11d forming a laser diode array 11. The laser diodes 11a–11d are driven by a biasing circuit 12 that supplies a bias current $I_b$ to each of the diodes 11a to 11d via respective inductances La–Ld, and a drive current pulse $I_d$, produced by a driver circuit 13 shown in FIG. 5(B), is superposed on the bias current $I_b$ supplied to each of the diodes 11a to 11d via respective capacitors Ca–Cd. Thereby, the biasing circuit 12 and the driver circuit 13 supply the bias current $I_b$ and the drive current pulse $I_d$ with the respective magnitudes thereof set to fall in the hatched region of FIG. 4. In the construction of FIG. 5(A), the substrate 10 acts as a heat sink for maintaining the laser diodes 11a–11d forming the array 11, at substantially the same temperature, while the illustrated construction lacks any means for regulating the temperature of the laser diode array 11. In other words, the temperature of the laser diode array 11 changes with the environmental temperature as well as with the heat that is generated by the operation of the laser diode array 11.

FIG. 5(B) shows the construction of the semiconductor optical source of FIG. 5(A) schematically, wherein each laser diode 11a–11d is driven by the common biasing circuit 12. There, it will be noted that there are provided a plurality of the drive circuits 13a–13d, each producing the drive current pulse $I_d$ in response to a drive signal that is supplied to the input terminal of the circuit 13. Thereby, a drive current is supplied to each laser diode La–Ld which is a sum of the drive current pulse $I_d$ and the bias current $I_b$.

Figure 6:
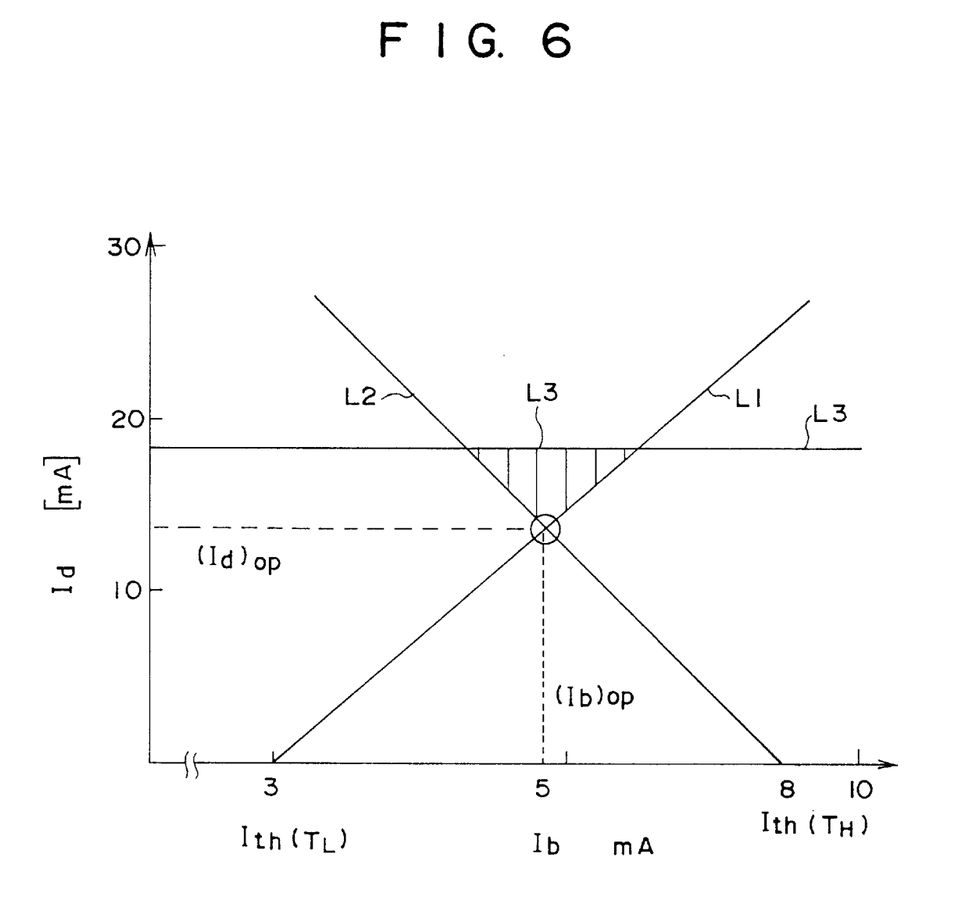
FIG. 6 is a diagram showing an example of the optimization of the operational condition in the semiconductor optical source of FIGS. 5(A) and 5(B).

In an example, a laser diode operable up to about 80° C. is used in the semiconductor optical source, and the semiconductor optical source is used in the variable temperature environment wherein the environmental temperature changes in the range between 25° C.–65° C. In this case, a temperature rise $\delta T$ of about 15° C. is tolerated for the laser diode, and this magnitude of the tolerance specifies the maximum drive current pulse of about 55 mA, based upon the relationship of Eq.(1). FIG. 6 shows the maximum drive current pulse thus obtained by the line $L_3$.

The lines $L_1$ and $L_2$ are determined, on the other hand, based upon the externally specified parameters $T_L$, $T_H$, R, $\tau_0$ and $\tau_s$ that are determined as follows.

$T_L = 25°$ C.

$T_H = 80°$ C.

$R = 10.0$ $\tau_0 = 400$ psec $\tau_s = 2$ nsec

Based upon the setting given above, the equation that specifies the line $L_1$ is represented as $$I_d = 9(I_b - 3),$$

while the equation that specifies the line $L_2$ is represented as $$I_d = 5.5(8 - I_b),$$

wherein the threshold bias current $I_{th}$ has a value of 3 mA at 25° C. ($I_{th}(T_L) = 5$ mA) and a value of 8 mA at 80° C. ($I_{th}(T_H) = 8.0$ mA).

Thereby, a triangular region shown in FIG. 6 by hatching is obtained as the region in which the operational condition of the laser diode is optimized. In particular, an operational point, defined at the intersection of the lines $L_1$ and $L_2$ and circled in FIG. 6, represents the operational point that satisfies the foregoing three conditions simultaneously and wherein the drive current $I_d$ is minimized. In other words, the operational point circled in FIG. 6 and represented by $(I_d)_{op}$ and $(I_b)_{op}$, minimizes the heat generation of the laser diode and provides the longest lifetime of the laser diode associated with the reduced heat generation. In the illustrated example, the optimized drive current pulse $(I_d)_{op}$ takes a value of 17.1 mA and the optimized bias current $(I_b)_{op}$ takes a value of 4.9 mA.

Generally, the laser diode to which the present invention is applicable and is operational in the temperature range above 40° C., is supplied with an optimized bias current, of which the magnitude thereof falls in the range between 1 mA and 10 mA and further with an optimized drive current pulse, of which the magnitude thereof falls in the range between 10 mA and 60 mA. In the foregoing example, the optimized bias current is set to about 5 mA, while the optimized drive current is set to about 20 mA.

Further, the present invention is not limited to the embodiments described heretofore, but various variations and modifications may be made without departing from the scope of the invention.

What is claimed is:

1. A semiconductor light source system for producing an output optical signal in response to an input electrical signal, comprising:
   a laser diode supplied with a drive current for producing said output optical signal in response thereto, said laser diode having a temperature-dependent operational characteristic that defines a relationship between an output power of said optical signal that is produced by said laser diode and the drive current that is supplied thereto, said semiconductor light source system being constructed such that said laser diode operates at a variable operational temperature;
   biasing means for producing a bias current having a first magnitude;
   driver means, supplied with said input electrical signal and responsive thereto, for producing a signal current having a second magnitude; and
   feeding means, supplied with said bias current and said signal current respectively from said biasing means and said driver means, for producing said drive current as a sum of said bias current and said signal current, said driver means supplying said drive current to said laser diode;
   said biasing means being set to produce said bias current with said first magnitude such that an operational temperature of said laser diode is maintained at a level equal to or lower than a temperature limit above which a normal operation of said laser diode is not guaranteed;
   said driver means being set to establish a relative ratio between said first magnitude of said bias current and said second magnitude of said signal current such that an extinction ratio, exceeding a predetermined extinction ratio, is obtained at a lowest operational temperature of said laser diode; and
   said driver means further being set to establish a relationship between said first magnitude of said bias current and said second magnitude of said signal current such that an oscillation delay of said laser diode is held below a selected delay time.

2. A semiconductor light source system as claimed in claim 1, comprising:
   a plurality of laser diodes, each of a substantially identical construction and arranged to form an array; and
   said biasing means supplies said bias current of said first magnitude to each of said laser diodes of said array.

3. A semiconductor light source system as claimed in claim 1, wherein:
   said laser diode has an active layer;
   said driver means is set such that said signal current of said second magnitude satisfies a first relationship:

$$T_{OH}+\delta T(I_d)<T_H$$

wherein $T_{OH}$ represents the temperature of an environment in which said laser diode is operated, $\delta T(I_d)$ represents a temperature rise of said laser diode upon activation by said signal current having said second magnitude, $I_d$ represents said signal current, and $T_H$ represents said temperature limit;
   said biasing means and said driver means are set such that said first magnitude of said bias current and said second magnitude of said signal current, respectively, satisfy a second relationship:

$$(I_b+I_d-I_{th}(T_L))/(I_b-I_{th}(T_L)) \geq R$$

wherein $I_b$ represents said bias current having said first magnitude, $I_{th}(T_L)$ represents a threshold bias current of said laser diode at the lowest operational temperature, and R represents an extinction ratio that is required for said optical signal; and
   said second magnitude of said signal current and said first magnitude of said bias current are set to satisfy a third relationship:

$$I_d \geq (I_{th}(T_H)-I_b) \times \exp(\tau_0/\tau_s)/[\exp(\tau_0/\tau_s)-1]$$

wherein $I_{th}(T_H)$ represents a threshold bias current of said laser diode at said temperature limit, $\tau_s$ represents a carrier lifetime in said active layer of said laser diode and $\tau_0$ represents a tolerable oscillation delay of said laser diode.

4. A semiconductor light source system as claimed in claim 3, wherein:
   said first magnitude of said bias current is set within a range between 1 mA and 10 mA; and
   said second magnitude of said signal current is set within a range between 10 mA and 60 mA.

5. A semiconductor light source system as claimed in claim 3, wherein said biasing means is set such that said first magnitude of said bias current is a minimum within a range such that said first through third relationships are satisfied simultaneously.

6. A semiconductor light source system as claimed in claim 5, wherein said first magnitude of said bias current is set to about 5 mA and said second magnitude of said siqnal current is set to about 20 mA.

7. A method for driving a laser diode which is operable in a variable temperature environment and which has an operational temperature of a level which changes in relation to an output power level of the laser diode operation, said laser diode being biased by a bias current for producing an output optical beam in response to a signal current that is superposed on said bias current, said method comprising the steps of:
   setting a magnitude of said signal current below an upper limit level that corresponds to a maximum operational temperature of the laser diode;
   setting a relative magnitude of said signal current with respect to said bias current such that an extinction ratio of a selected level is achieved in said output optical beam; and
   setting a relative magnitude of said signal current with respect to said bias current such that an oscillation delay of a selected level is achieved in the laser diode.

8. A method for driving a laser diode as claimed in claim 7, wherein the laser diode has an active layer, further comprising:

setting said signal current, said driver means is set such that said signal current of said second magnitude satisfies a first relationship:

$$T_{OH} + \delta T(I_d) < T_H$$

wherein $T_{OH}$ represents the temperature of an environment in which said laser diode is operated, $\delta T(I_d)$ represents a temperature rise of said laser diode upon activation by said signal current having said second magnitude, $I_d$ represents said signal current, and $T_H$ represents said temperature limit;

setting the bias and signal currents such that said biasing means and said driver means are set such that said first magnitude of said bias current and said second magnitude of said signal current, respectively, satisfy a second relationship:

$$(I_b + I_d - I_{th}(T_L))/(I_b - I_{th}(T_L)) \geq R$$

wherein $I_b$ represents said bias current having said first magnitude, $I_{th(TL)}$ represents a threshold bias current of said laser diode at the lowest operational temperature, and R represents an extinction ratio that is required for said optical signal; and setting said second magnitude of said signal current and said first magnitude of said bias current are set to satisfy a third relationship:

$$I_d \geq (I_{th}(T_H) - I_b) \times \exp(\tau_0/\tau_s)/[\exp(\tau_0/\tau_s) - 1]$$

wherein $I_{th}(T_H)$ represents a threshold bias current of said laser diode at said temperature limit, $\tau_s$ represents a carrier lifetime in said active layer of said laser diode and $\tau_0$ represents a tolerable oscillation delay of said laser diode.

9. A method as claimed in claim 8, further comprising:

defining said first magnitude range so as to satisfy a first relationship:

$$T_{OH} + \delta T(I_d) < T_H$$

wherein $T_{OH}$ represents the temperature of an environment in which said laser diode is operated, $\delta T(I_d)$ represents a temperature rise of said laser diode upon activation by a signal current within said first magnitude range, $I_d$ represents said signal current, and $T_H$ represents said temperature limit;

defining said second magnitude range to satisfy a second relationship:

$$(I_b + I_d - I_{th}(T_L))/(I_b - I_{th}(T_L)) \geq R$$

wherein $I_b$ represents said bias current level, $T_{th}(T_L)$ represents a threshold bias current of said laser diode at the lowest operational temperature, and R represents an extinction ratio that is required for said optical signal; and setting the respective magnitudes of said signal current and said bias current, further, so as to satisfy a third relationship:

$$I_d \geq (I_{th}(T_H) - I_b) \times \exp(\tau_0/\tau_s)/[\exp(\tau_0/\tau_s) - 1]$$

wherein $I_{th}(T_H)$ represents a threshold bias current of said laser diode at said upper temperature limit, $\tau_s$ represents a carrier lifetime in an active layer of said laser diode and $\tau_0$ represents a tolerable oscillation delay of said laser diode.

10. A method as claimed in claim 9, further comprising:

setting said bias current to about 5 mA and setting said signal current to about 20 mA.

11. A semiconductor light source for producing an output optical signal in response to an input electrical signal, comprising:

a laser diode biased for operation by a bias current and responsive to a signal current superposed on the bias current for producing an output optical beam of a variable power level in accordance with a variable level of the sum of the bias and signal currents, the laser diode having an operational temperature of a variable level within a range dependent on ambient temperature and on the variable power level of the output optical beam, and the operational temperature range having a maximum upper temperature limit for normal operation, in turn defining a first magnitude range, having an upper limit, of the sum of the bias current and signal current levels, the laser diode further having an extinction ratio defined by the relative, respective levels of the bias current and the signal current and correspondingly defining a second magnitude range of said drive current, within said first magnitude range and relative to said bias current, which establishes an extinction ratio of said output optical beam of a selected level, and oscillation delay characteristic defined by the respective levels of the drive current and the bias current and, in turn, defining a third magnitude range of the drive current, within the second magnitude range and relative to the bias current which establishes an oscillation delay of a selected level;

a bias circuit supplying a bias current of a fixed level, relative to the drive current level, such that the sum of the drive and bias currents is within the first magnitude range;

a driver circuit supplying a drive current of a level, relative to the bias current level, which is within the second magnitude range and which establishes an extinction ratio of the selected level; and a feeder circuit which feeds the sum of the drive current and the bias current to the laser diode, for operating the laser diode.

12. A method as claimed in claim 11, further comprising:

setting s aid bias current to a fixed level within a range between 1 mA and 10 mA; and setting said signal current to a level within a range between 10 mA and 60 mA.

13. A method as claimed in claim 11, further comprising:

setting said bias current to a fixed, minimum level, within a range such that said first through third relationships are satisfied simultaneously.

14. A method for driving a laser diode which is operable in a variable temperature environment and which has an operational temperature of a level which changes in relation to ambient temperature and an output power level of the laser diode operation, said laser diode being biased by a bias current and responsive to a drive current, superposed on said bias current, for producing an output optical beam having a power level determined by the sum of the drive and bias currents, said method comprising the steps of:

defining a first magnitude range, of the sum of the drive and bias currents, having an upper limit that corresponds to a maximum operational temperature of the laser diode;

defining a second magnitude range of said drive current, within said first magnitude range and relative to said bias current, which establishes an extinction ratio of said output optical beam of a selected level;

defining a third magnitude range of said drive current, within said second magnitude range and relative to said bias current, which establishes an oscillation delay in the laser diode of a selected level; and setting a fixed level bias current and a maximum driver current level within the third magnitude range, relative to the fixed bias current level, and supplying a bias current of the fixed level bias current and a signal current limited to the maximum level drive current to the laser diode, for driving the laser diode.

* * * * *